(12) United States Patent
Bhattacharya

(10) Patent No.: US 8,369,540 B2
(45) Date of Patent: Feb. 5, 2013

(54) AUDIO SIGNAL AMPLIFICATION

(75) Inventor: Puranjoy Bhattacharya, Bangalore (IN)

(73) Assignee: NXP B.V., Eindhoven (NL)

( * ) Notice: Subject to any disclaimer, the term of this patent is extended or adjusted under 35 U.S.C. 154(b) by 737 days.

(21) Appl. No.: 12/599,814

(22) PCT Filed: May 14, 2008

(86) PCT No.: PCT/IB2008/051896
§ 371 (c)(1),
(2), (4) Date: Nov. 12, 2009

(87) PCT Pub. No.: WO2008/146189
PCT Pub. Date: Dec. 4, 2008

(65) Prior Publication Data
US 2010/0215194 A1    Aug. 26, 2010

(30) Foreign Application Priority Data
May 30, 2007    (EP) .................................... 07109248

(51) Int. Cl.
*H03G 3/00* (2006.01)
(52) U.S. Cl. ........................................ 381/104; 381/109
(58) Field of Classification Search .................. 381/104, 381/106, 107, 120, 109; 330/268, 274, 278, 330/284
See application file for complete search history.

(56) References Cited

U.S. PATENT DOCUMENTS

| | | | | |
|---|---|---|---|---|
| 5,677,962 | A | * | 10/1997 | Harrison et al. ............... 381/109 |
| 6,088,461 | A | * | 7/2000 | Lin et al. ........................ 381/104 |
| 8,126,164 | B2 | * | 2/2012 | Bjorn-Josefsen et al. .... 381/109 |
| 8,194,889 | B2 | * | 6/2012 | Seefeldt ......................... 381/107 |
| 2001/0026624 | A1 | | 10/2001 | Kon et al. |
| 2005/0175194 | A1 | | 8/2005 | Anderson |
| 2009/0323985 | A1 | * | 12/2009 | Garudadri et al. ............. 381/104 |

FOREIGN PATENT DOCUMENTS

| | | |
|---|---|---|
| JP | 07-240647 A | 9/1995 |
| JP | 2001298336 A | 10/2001 |
| JP | 2003036081 A | 2/2003 |

OTHER PUBLICATIONS

International Search Report for Application No. PCT/IB2008/051896 (Dec. 3, 2008) ddd.

* cited by examiner

*Primary Examiner* — Duc Nguyen
*Assistant Examiner* — Kile Blair

(57) ABSTRACT

A system for amplifying a digital audio signal comprises a receiver 12 for receiving a digital audio signal, a level estimator 14 arranged to calculate the audio level of the digital audio signal, a gain control 16 arranged to receive a gain level, the gain level defining the desired amplification of the digital audio signal, a logic circuit 18 arranged to calculate the headspace in the digital audio signal and to divide the gain level into a scaling gain and an amplifier gain, the scaling gain not exceeding the calculated headspace, a digital signal processor 20 arranged to amplify the digital audio signal with the scaling gain, a digital-to-analogue converter 22 arranged to convert the amplified digital audio signal into an analogue signal, and an amplifier 24 arranged to amplify the analogue audio signal with the amplifier gain.

8 Claims, 4 Drawing Sheets

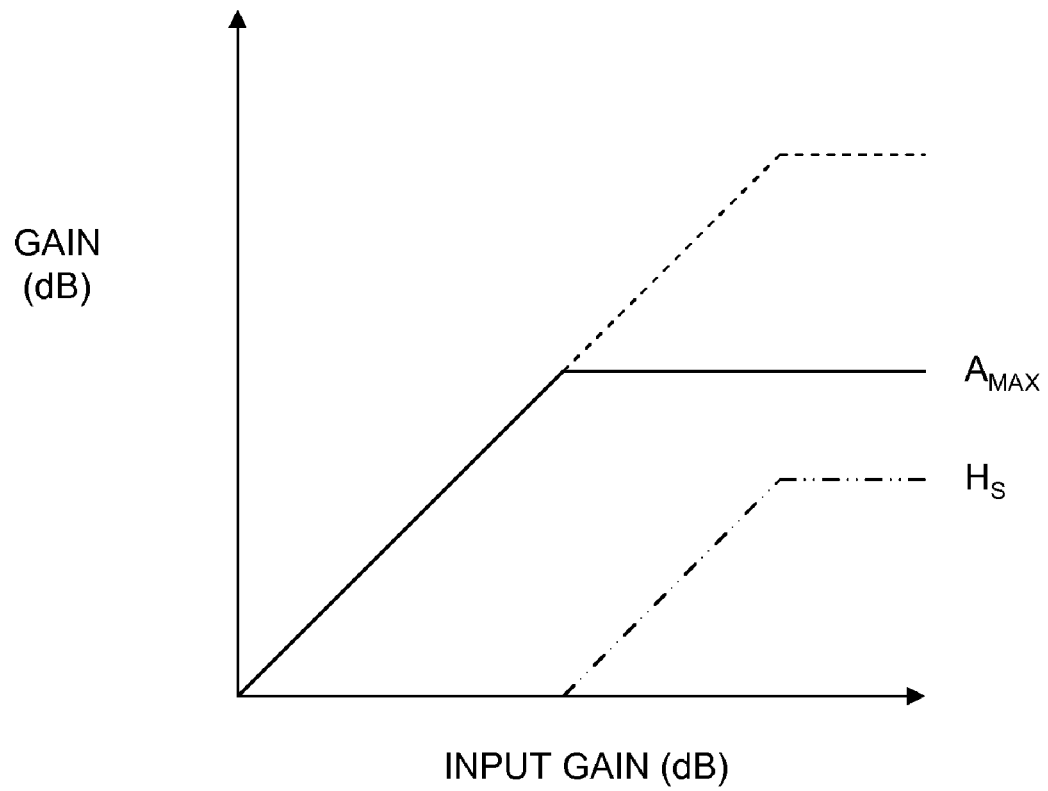
Fig. 4
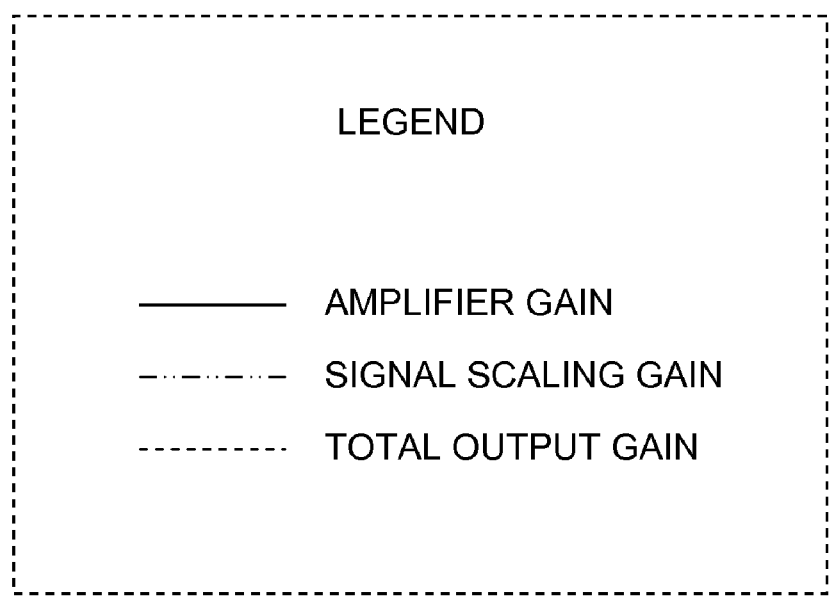

AUDIO SIGNAL AMPLIFICATION

This invention relates to method of and a system for amplifying a digital audio signal. The invention provides signal scaling assisted volume amplification.

Volume control in multimedia systems is typically achieved through a gain setting provided to the amplifier, as shown schematically in FIG. 1. The gain in dB, provided by the amplifier, can be both positive as well as negative. Frequently though, amplifiers produce distortions for very low or high gain settings. Non-switching audio amplifiers, for example those of class A, AB, B, BC etc. utilise the linear range of transistors, as a result of which they produce distortions at very high and low settings. The distortion is especially audible at high volume settings where the amplifier curve saturates, and the output audio levels do not increase substantially with increased amplifier settings. In recent years, Class-D amplifiers have been developed that provide distortions comparable to the non-switching audio amplifiers, but the maximum output levels are still relatively low.

An alternate approach to volume control is to provide an amplifier with constant gain at the audio output, while scaling the digital audio signal down to an appropriate level in a digital signal processor, as shown schematically in FIG. 2. Note that the gain setting in this case, provided by the digital signal processor (DSP) is always less than or equal to 0 dB (unity gain). Under this set-up, the amplifier uses up the same amount of output power no matter what the volume setting by the user, as the amplifier is providing a constant gain, and the DSP is providing a variable gain.

Splitting of the signal amplification between two amplifiers is known from, for example, United States of America Patent Application Publication US 2001/0026624, which discloses a system in which volume adjustment is performed in small steps at a DSP and volume adjustment is performed in wide steps at electronic volume circuits. Adjustment only by the DSP is performed for a small volume range less than or equal to a predetermined level. For a volume higher than or equal to the predetermined level, fine adjustment by the DSP at the transient period of volume adjustment is combined to reduce the increment of variation so that the volume adjustment is performed gradually. However this system does not solve the problem of reducing the distortion of the input signal at high and low levels of amplification.

It is therefore an object of the invention to improve upon the known art.

According to a first aspect of the present invention, there is provided a method of amplifying a digital audio signal comprising receiving a digital audio signal, calculating the audio level of the digital audio signal, receiving a gain level, said gain level defining the desired amplification of the digital audio signal, calculating the headspace in the digital audio signal, dividing the gain level into a scaling gain and an amplifier gain, said scaling gain not exceeding the calculated headspace, amplifying the digital audio signal at a digital signal processor with the scaling gain, converting the amplified digital audio signal into an analogue signal, and amplifying the analogue audio signal at an amplifier with the amplifier gain.

According to a second aspect of the present invention, there is provided a system for amplifying a digital audio signal comprising a receiver for receiving a digital audio signal, a level estimator arranged to calculate the audio level of the digital audio signal, a gain control arranged to receive a gain level, said gain level defining the desired amplification of the digital audio signal, a logic circuit arranged to calculate the headspace in the digital audio signal and to divide the gain level into a scaling gain and an amplifier gain, said scaling gain not exceeding the calculated headspace, a digital signal processor arranged to amplify the digital audio signal with the scaling gain, a digital-to-analogue converter arranged to convert the amplified digital audio signal into an analogue signal, and an amplifier arranged to amplify the analogue audio signal with the amplifier gain.

Owing to the invention, it is possible to provide an amplifying system that solves the problem of achieving high gain settings for audio signals having low input level, without distortion, by using signal scaling assistance from a digital signal processor. For very high volume settings, the aggregate gain that the user wishes to obtain is achieved through a conjunction of simultaneous gain setting for the amplifier and signal scaling on the DSP so as to minimize the overall distortion. The respective gain settings are adaptively derived based on short-term signal level characteristics computed on the signal processor. A digital level limiter on the DSP ensures that signal clipping does not occur. One advantage of this invention is that the effective gain settings achieved in the process (for audio signals having low levels) significantly extend beyond that of the amplifier alone without compromising on the quality of audio output. For class-B/C amplifiers, the technique can also be extended to provide good signal quality at very low volume levels.

Advantageously, the step of calculating the headspace in the digital audio signal comprises calculating the headspace according to the formula $H_s = L_c - L_a$, where $L_c$ is an error margin and $L_a$ is the audio level of the digital audio signal. This simple formula for the calculation of the headspace ensures that no audio artefacts occur in the outputted signal.

Preferably, the amplifying method further comprises accessing an amplifier gain limit for the amplifier. During the amplifying of the analogue audio signal at an amplifier with the amplifier gain, the maximum amplification applied by the amplifier does not exceed the amplifier gain limit. Similarly, the dividing of the gain level into a scaling gain and an amplifier gain, where the scaling gain does not exceed the calculated headspace, comprises setting the amplifier gain equal to the amplifier gain limit and setting the scaling gain equal to the gain level minus the amplifier gain limit.

Volume gain in multimedia systems is typically achieved through a gain setting provided to the amplifier, or through digital audio signal scaling. Both techniques assume the audio signal to be full-scale, and transfer the onus of audio level enhancement to the amplifier. Most amplifiers produce distortions for high gain settings. And most real-life signals cover only a fraction of the available dynamic range.

All of the known techniques for audio gain control assume that the audio signal is full scale i.e. covers the entire digital dynamic range. In reality, the input signal level is often much lower, and it is to cater to the needs of listening to such audio signals that audio systems are stretched to their maximum levels. Even normal audio signals are typically expected to cover only about 70% of the audio dynamic range. The present invention seeks to use the available dynamic range headspace for the received audio signal to provide a higher gain setting than possible through use of the amplifier alone. This is especially valuable when the input signal level is low.

The present invention operates by dividing the aggregate gain set by the user into two parts, firstly a gain setting on the amplifier, and secondly a gain setting on signal scalar in the digital signal processor that can assume a value greater than 1. In this way, the range of user-settable gain effectively increases beyond what the amplifier can provide in isolation, at a low cost. The alternative for this to enable handling of input signals with low levels would be to have amplifiers with larger gain ranges, which would be wasteful in terms of system cost and power consumption.

Embodiments of the present invention will now be described, by way of example only, with reference to the accompanying drawings, in which:

FIG. 4 is a graph showing an example of how an input gain to the system of FIG. 3 can be split between a scaling gain and an amplifier gain.

Figure 1:
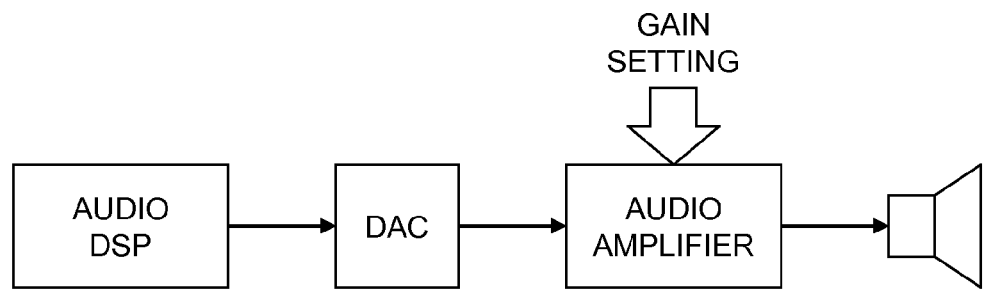
FIG. 1 is a schematic diagram of volume gain setting into an amplifier.
Figure 2:
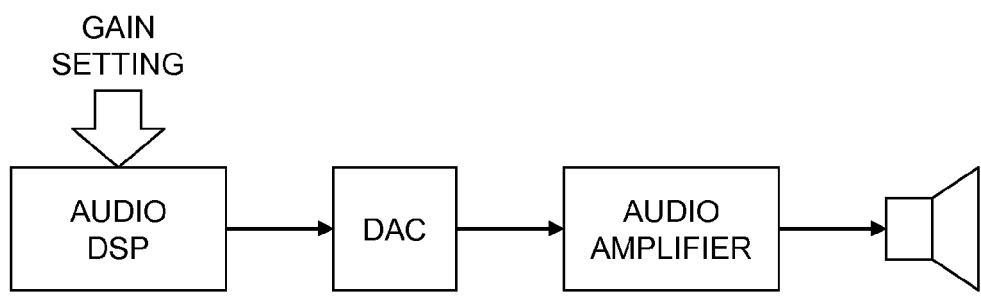
FIG. 2 is a schematic diagram of the use of signal scaling for gain setting.
Figure 3:
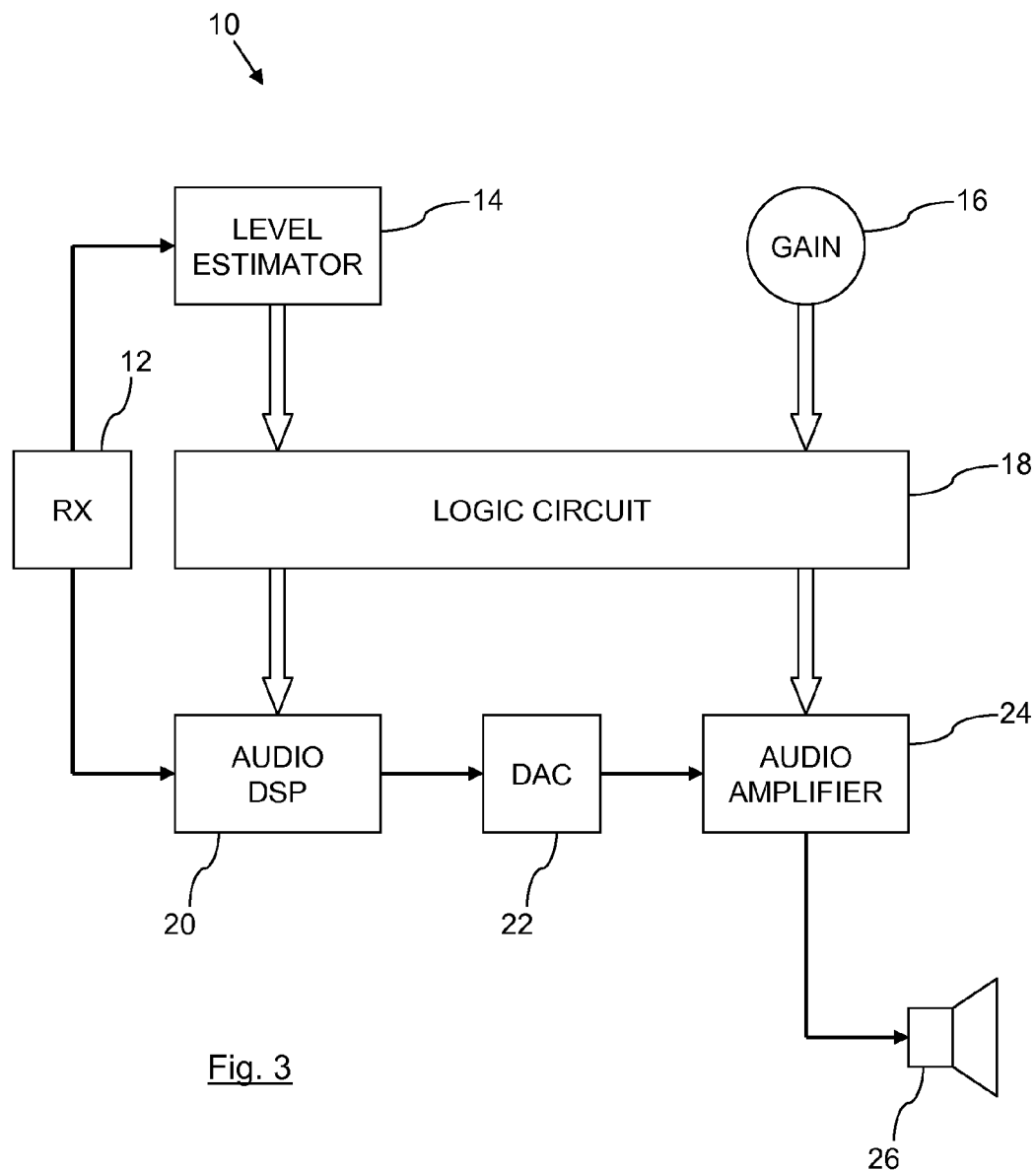
FIG. 3 is a schematic diagram of a system for amplifying a digital audio signal.

FIG. 3 shows an example of a system 10 according to the invention, for amplifying a digital audio signal. The system 10 comprises a receiver 12 for receiving the digital audio signal, a level estimator 14 arranged to calculate the audio level in the digital audio signal, a gain control 16 arranged to receive a gain level set by a user, the gain level defining the desired amplification of the digital audio signal, and a logic circuit 18, which is arranged to calculate the headspace in the audio signal (from the calculated audio level), and to divide the gain level into a scaling gain and an amplifier gain, the scaling gain not exceeding the calculated headspace.

Additionally, the system 10 comprises a digital signal processor 20 arranged to amplify the digital audio signal with the scaling gain, a digital-to-analogue converter 22 arranged to convert the amplified digital audio signal into an analogue signal, an amplifier 24 arranged to amplify the analogue audio signal with the amplifier gain, and a loudspeaker 26, which outputs the amplified audio signal.

The system 10 provides signal scaling assisted volume amplification. Digital audio systems typically comprise a DSP for scaling the gain of the digital audio signal, and an audio amplifier that is used to drive the speakers once the digital signal has been converted into analogue form. Digital audio volume control in multimedia systems is typically achieved through controlling the gain of the audio amplifier. One of the drawbacks with this method of gain control is that the amplified signal often becomes distorted when the amplifier is set to very low or very high gain. The digital audio signals often only utilise 70% of the possible dynamic range of the digital signal format, and sometime much less.

The system 10 is operated so that the gain of the digital signal (by the DSP 20) is increased above a factor of 1, so that the amplifier 24 does not need to be driven to such a high gain in order to give an equivalent output volume level. This reduces the distortion added by the amplifier 24, and means that a lower-gain amplifier 24 can be used, reducing the cost of the amplifier 24, the power consumption, and the heat-sink requirements etc.

The gains of the DSP 20 and of the amplifier 24 are controlled together, so that the gain of the DSP 20 is controlled to keep the gain of the amplifier 24 within its non-distorting range. This can be achieved either by increasing the gain of the DSP 20 to achieve higher output volume levels after the audio amplifier 24 has been set to its maximum non-distorting gain, or by reducing the gain of the DSP 20 to achieve lower output volume levels after the audio amplifier 24 has been set to its minimum non-distorting gain.

In use, the user will set the overall required gain required from the system 10, through the gain control 16, and then the system 10, through the logic circuit 18 will split the gain between the DSP 20 and the audio amplifier 24 such that the audio amplifier 24 is never driven into gain levels that would cause the audio amplifier 24 to distort the received digital audio signal.

The audio level estimator 14 takes the received digital audio signal as its input and generates an estimate of the audio level in dB, assuming 0 dB setting for the full-scale signal. The level estimator 14 is short-term, with a smoothing time-constant of 5-30 ms, and may be block-based. There are various possible implementations of the audio level estimator 14, such as a rectifier followed by a low-pass filter and conversion of the obtained output to dB.

The gain setting logic 18 has two different inputs, the user gain setting in dB ($G_{IU}$), from the gain control 16, and the audio level in dB ($L_A$), from the level estimator 14. The second setting allows the logic circuit 18 to calculate the headspace available ($H_S$) for audio signal scaling by using:

$$H_S = L_C - L_A$$

where $L_C$ is a small margin, for example, −0.3 dB, left for operational convenience. The constant $A_{MAX}$ is the maximum amplifier level in dB that can be achieved by the amplifier 24, with negligible audio distortion. This then forms the logical limit for the amplifier setting. The output scaling ($G_{OS}$) and amplifier ($G_{OA}$) gains are then obtained as follows:

$$G_{OA} = \begin{matrix} G_{IU} & \text{if } G_{IU} \leq A_{MAX} \\ A_{MAX} & \text{otherwise} \end{matrix}$$

The preferred signal scaling required under this setting is:

$$G_{SP} = G_{IU} - G_{OA}$$

where $G_{SP}$ is the amount of gain that would be thrust on the signal scalar (the DSP 20) if it were not constrained by the availability of scaling headspace $H_S$. Typically, this is the amount of signal scaling that we would like to provide assuming that the input audio signal provides equivalent headspace. In the event that this assumption is not valid, level-saturation logic is used to prevent audio distortion through signal clipping. The output scaling gain is thus obtained as follows:

$$G_{OS} = \begin{matrix} G_{SP} & \text{if } G_{SP} \leq H_S \\ H_S & \text{otherwise} \end{matrix}$$

The above design provides for signal scaling only after the amplifier 24 has reached the limit of its low-distortion range. It is possible to have variations over the above scheme where the gain $G_{IU}$ at any given point of time is partitioned into non-trivial gain values $G_{OA}$ and $G_{OS}$ respectively. It is also feasible to extend this gain-sharing scheme for very low gain settings, at which the amplifier 24 may again have a limit beyond which distortion sets in. The logic circuit 18 is simply splitting the total gain required by the gain control 16 between the two gain circuits 20 and 24, according to one or more algorithms.

The system 10 effectively increases the range of user-settable gain of an audio amplifier beyond what it can provide in isolation, at a low cost. By this, it allows an audio (or audio-video) playback system to deliver requisite output audio level without a more expensive and power-consuming amplifier. The system 10 can be deployed across the entire range of digital audio (or audio-video) systems that use digital signal processing in addition to having an audio amplifier at the output stage.

FIG. 3 illustrates graphically one embodiment of the splitting of the gain between the DSP 20 and the amplifier 24. On the x-axis is the input gain level set by the user via the gain control 16, and on the y-axis is the output gain delivered by both amplifying devices, the DSP 20 and analogue amplifier 24. The logic circuit 18 divides the total gain between the DSP 20 and analogue amplifier 24. In the algorithm embodied in the graph of FIG. 4, the amplifier 24 is operated to provide the gain of the system 10, until the level $A_{MAX}$ is reached.

The logic circuit 18 is arranged so that signal scaling in the audio DSP 20 is only used once the amplifiers gain limit ($A_{MAX}$) for high fidelity output has been reached. Thereafter, any residual gain is preferentially provided by the signal scalar (the DSP 20). The gain delivered by the DSP 20 is limited by the available headspace ($H_S$) of the input audio signal; if this headspace is exceeded, the signal will clip or wrap-around, leading to serious distortions. Therefore, the scaling gain that is imposed on the audio signal by the DSP 20 is the minimum of the residual gain and the available scaling headspace ($H_S$) of the input audio signal.

The system 10 takes advantage of the fact that for the vast majority of real-life audio signals, the signal only spans a part of the available dynamic range. This leaves headspace for signal scaling that is then used to assist the amplifier 24 in increasing the outputted audio levels. The method implemented by the system 10 therefore provides for a dynamic temporal measurement of the audio headspace ($H_S$), and the logic circuit 18 uses this to assist volume scaling to levels that, in a conventional system, would have caused severe audio distortion if implemented through a low-cost amplifier alone, or would have required an amplifier with substantially higher capabilities.

Figure 5:
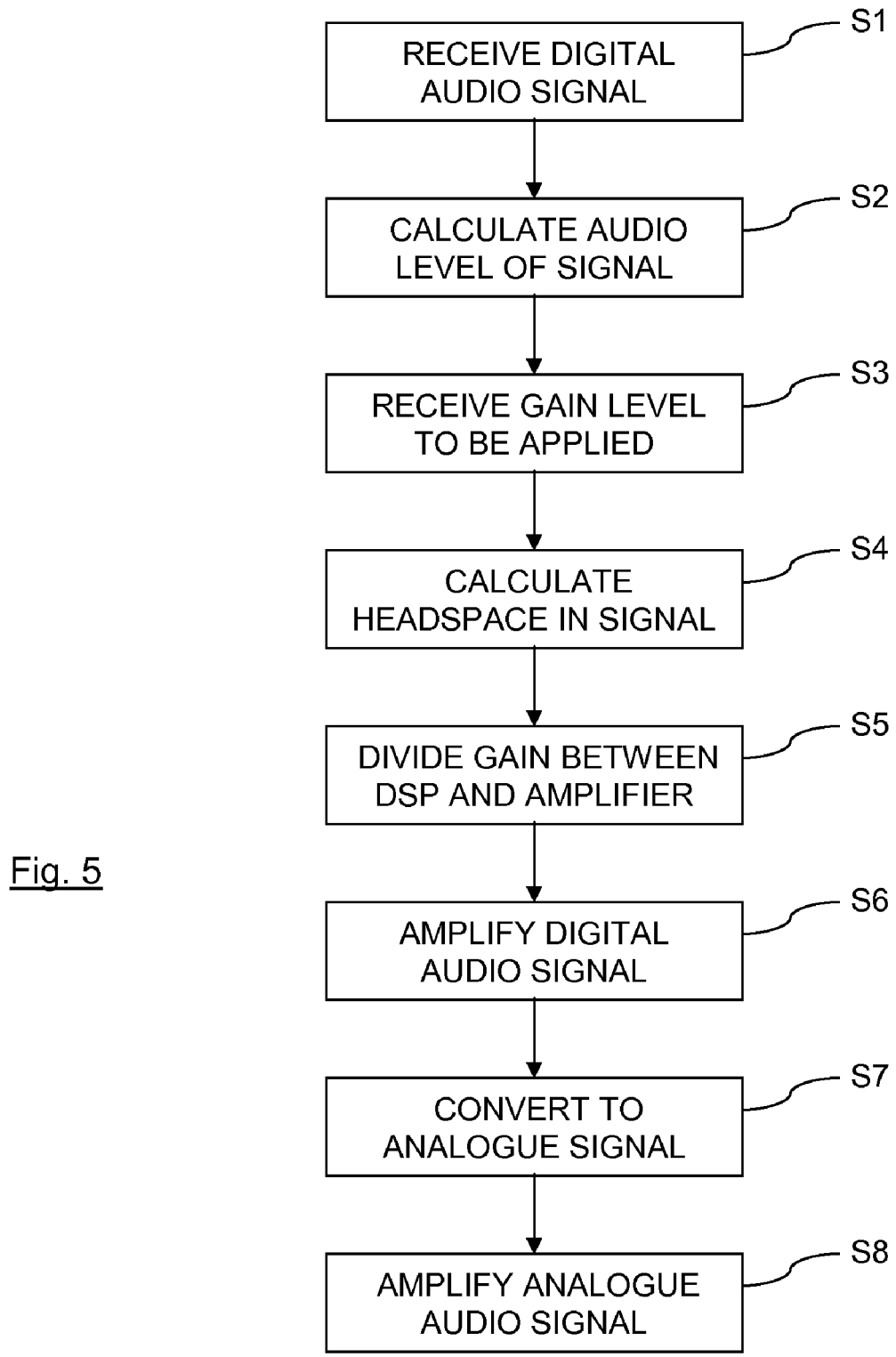
FIG. 5 is a flow diagram of a method of amplifying a digital audio signal.

The method of amplifying the digital audio signal is summarised in FIG. 5. The method comprises the steps 51 receiving the digital audio signal, step S2 calculating the audio level of the digital audio signal, step S3 receiving a gain level from the gain control 16, the gain level defining the desired amplification of the digital audio signal, step S4 calculating the headspace in the digital audio signal, step S5 dividing the gain level into a scaling gain and an amplifier gain (the scaling gain not exceeding the calculated headspace), step S6 amplifying the digital audio signal at the digital signal processor 20 with the scaling gain, step S7 converting the amplified digital audio signal into an analogue signal at the DAC 22, and finally step S8 amplifying the analogue audio signal at the amplifier 24 with the amplifier gain.

From reading the present disclosure, other variations and modifications will be apparent to the skilled person. Such variations and modifications may involve equivalent and other features which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of amplifying a digital audio signal comprising
   receiving the digital audio signal,
   calculating an audio level of the digital audio signal,
   receiving a gain level, said gain level defining a desired amplification of the digital audio signal,
   calculating a headspace $H_s$ in the digital audio signal according to a formula $H_s=L_c-L_a$, where $L_c$ is an error margin and $L_a$ is the audio level of the digital audio signal,
   dividing the gain level into a scaling gain and an amplifier gain, said scaling gain not exceeding the calculated headspace,
   amplifying the digital audio signal at a digital signal processor with the scaling gain to obtain an amplified digital audio signal,
   converting the amplified digital audio signal into an analogue signal, and
   amplifying the analogue audio signal at an amplifier with the amplifier gain.

2. A method according to claim 1, further comprising accessing an amplifier gain limit for the amplifier.

3. A method according to claim 2, wherein, during the step of amplifying the analogue audio signal at an amplifier with the amplifier gain, the maximum amplification applied by the amplifier does not exceed the amplifier gain limit.

4. A method according to claim 2, wherein the step of dividing the gain level into a scaling gain and an amplifier gain, said scaling gain not exceeding the calculated headspace, comprises setting the amplifier gain at least approximately equal to the amplifier gain limit and setting the scaling gain at least approximately equal to the gain level minus the amplifier gain limit.

5. A system for amplifying a digital audio signal comprising
   a receiver for receiving the digital audio signal,
   a level estimator arranged to calculate an audio level of the digital audio signal,
   a gain control arranged to receive a gain level, said gain level defining a desired amplification of the digital audio signal,
   a logic circuit arranged to calculate a headspace $H_s$ in the digital audio signal, according to a formula $H_s=L_c-L_a$, where $L_c$ is an error margin and $L_a$ is the audio level of the digital audio signal, and to divide the gain level into a scaling gain and an amplifier gain, said scaling gain not exceeding the calculated headspace,
   a digital signal processor arranged to amplify the digital audio signal with the scaling gain to obtain an amplified digital audio signal,
   a digital-to-analogue converter arranged to convert the amplified digital audio signal into an analogue signal, and an amplifier arranged to amplify the analogue audio signal with the amplifier gain.

6. A system according to claim 5, wherein the logic circuit is further arranged to access an amplifier gain limit for the amplifier.

7. A system according to claim 6, wherein the logic circuit is further arranged to ensure that, during the step of amplifying the analogue audio signal at an amplifier with the amplifier gain, the maximum amplification applied by the amplifier does not exceed the amplifier gain limit.

8. A system according to claim 6, wherein the logic circuit is further arranged, when dividing the gain level into a scaling gain and an amplifier gain, said scaling gain not exceeding the calculated headspace, to set the amplifier gain at least approximately equal to the amplifier gain limit and to set the scaling gain at least approximately equal to the gain level minus the amplifier gain limit.

* * * * *